United States Patent [19]
Fasnacht et al.

[11] Patent Number: 5,999,002
[45] Date of Patent: Dec. 7, 1999

[54] CONTACT CHECK FOR REMOTE SENSED MEASUREMENT

[75] Inventors: Glenn Fasnacht, Twinsburg; Wayne Goeke, Hudson, both of Ohio

[73] Assignee: Keithley Instruments, Inc., Cleveland, Ohio

[21] Appl. No.: 08/948,789

[22] Filed: Oct. 10, 1997

Related U.S. Application Data

[63] Continuation-in-part of application No. 08/911,781, Aug. 15, 1997.

[51] Int. Cl.⁶ .................................................. G01R 31/08
[52] U.S. Cl. .......................... 324/525; 324/538; 324/715; 324/611; 324/537; 324/756; 324/754; 324/421; 324/602; 324/609; 324/696; 324/704; 324/705; 324/713; 324/419
[58] Field of Search ...................................... 324/538, 715, 324/525, 611, 537, 756, 754, 421, 602, 609, 696, 704, 705, 713, 419

[56] References Cited

U.S. PATENT DOCUMENTS

| | | | |
|---|---|---|---|
| 4,342,957 | 8/1982 | Russell | 324/754 |
| 4,876,515 | 10/1989 | Ball | 324/538 |
| 4,954,782 | 9/1990 | Ball | 324/538 |
| 5,461,358 | 10/1995 | Ravas | 324/715 |
| 5,600,249 | 2/1997 | Yagi | 324/715 |
| 5,804,979 | 9/1998 | Lund | 324/715 |

*Primary Examiner*—Maura Regan
*Attorney, Agent, or Firm*—Pearne, Gordon, McCoy & Granger LLP

[57] ABSTRACT

A contact resistance check circuit and method for verifying that a sufficient electrical connection is established between a source and a sense lead of a Kelvin connection. The circuit includes a microprocessor for driving a transformer that is connected to the source/sense probe (i.e., contact resistance) with an input pulse. The input pulse is altered in relation to the magnitude of the contact resistance to produce a check pulse. A comparator is used to compare the check pulse with a threshold voltage and for generating a fault indication signal. A flip flop then stores the fault indication signal so that the fault indication signal may be monitored by the microprocessor.

8 Claims, 5 Drawing Sheets

CONTACT CHECK FOR REMOTE SENSED MEASUREMENT

This application is a continuation-in-part of application Ser. No. 08/911,781 filed Aug. 15, 1997.

BACKGROUND OF THE INVENTION

The present invention generally relates to a device and method for verifying that a sufficient electrical connection is established between a source and a sense lead of a Kelvin connection.

It is common to test some devices by making a remote sensed measurement using a Kelvin connection. In a Kelvin connection, the device under test, or DUT, is probed by source leads at contact points of the DUT. Each contact point is also probed by a sense lead. The source and sense leads operate in combination to test the DUT by making appropriate electrical measurements.

There is a need in the art for a contact check to verify that a sufficient electrical connection is established between the source and sense leads of a Kelvin connection. The contact check must be made in such a way as to minimize any interference with the test being conducted and be completed in the shortest possible time. The contact check must be able to be made concurrently or consecutively with the test measurement.

SUMMARY OF THE INVENTION

The present invention provides a device and a method for performing a contact check of a Kelvin connection concurrently or consecutively with a test measurement. The present invention minimizes or eliminates any interference with the test measurement being taken and is completed in a very short time span.

According to a first embodiment of the present invention, the contact check circuit includes, a microprocessor for generating an input pulse. The input pulse is used to drive a primary winding of a transformer. A secondary winding of the transformer is connected to a contact resistance so that the input pulse is altered in relation to the magnitude of the contact resistance so as to form a check pulse. A comparator is used to compare the check pulse with a threshold voltage generated by a voltage divider. The comparator generates a fault indication signal which is stored by a flip flop connected to the comparator. The microprocessor monitors the signal stored by the flip flop.

According to another aspect of the first embodiment of the invention, the check circuit includes a low pass filter connected to filter the check pulse before the comparator compares the check pulse with the threshold voltage.

According to another aspect of the first embodiment of the invention, inverters are used to invert the input pulse before it drives the transformer and to invert the fault indication signal before it is stored.

According to a second embodiment of the present invention, the contact check circuit includes, a microprocessor for generating an input pulse. The input pulse is used to drive a primary winding of a transformer. A secondary winding of the transformer is connected to a contact resistance so that the input pulse is altered in relation to the magnitude of the contact resistance so as to form a check pulse. A comparator is used to compare the check pulse with a threshold voltage generated by a transformer connected to a control resistance. The comparator generates a fault indication signal which is stored by a flip flop connected to the comparator. The microprocessor monitors the signal stored by the flip flop.

According to another aspect of the second embodiment of the invention, the check circuit includes a delay for delaying the input pulse, and a differentiator for differentiating the delayed input pulse to become a short pulse, or clock pulse, occurring during the middle of the input pulse. The clock pulse is used to clock the flip flop so that an incorrect fault indication signal, resulting from voltage spiking at the beginning or end of the input pulse, is not stored by the flip flop.

According to another aspect of the first embodiment of the invention, inverters are used to invert the input pulse before it drives the transformers.

BRIEF DESCRIPTION OF THE SEVERAL VIEWS OF THE DRAWINGS

These and further features of the present invention will be apparent with reference to the following description and drawings, wherein.

DETAILED DESCRIPTION OF PREFERRED EMBODIMENT

Figure 1:
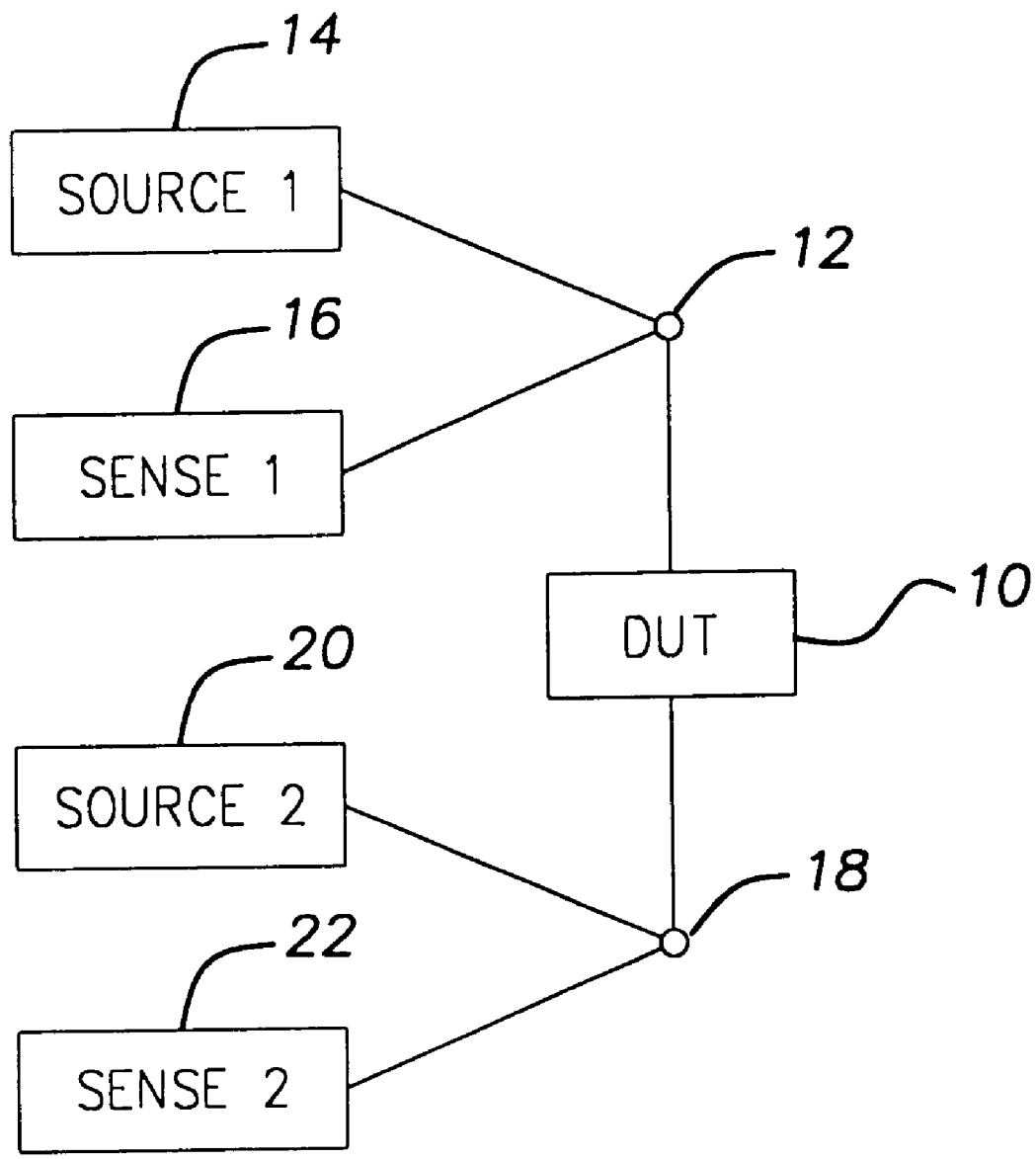
FIG. 1 is a circuit diagram of a typical Kelvin connection.

In the detailed description which follows, identical components have been given the same reference numerals, and, in order to clearly and concisely illustrate the present invention, certain features may be shown in somewhat schematic form.

FIG. 1 illustrates a typical Kelvin connection used for making a test measurement of a device under test, or DUT 10. The test measurement is typically, but not necessarily, a DC measurement. DUT 10 is subjected to measurement by probing a first contact point 12 of the DUT 10 with a first source 14 and a first sense 16, and by probing a second contact point 18 of the DUT 10 with a second source 20 and a second sense 22. There is an inherent resistance in the connection between any of the sources 14, 20 or senses 16, 22 and the respective contact points 12, 18. If a poor connection exists between any of these points the resistance of the connection will be too high for successful test measurement of the DUT 10. The present invention checks the contact effectiveness of the Kelvin connection by evaluating the inherent resistance in the path from the first source 14 through the first contact point 12 and to the first sense 16, and in the path from the second source 20 through the second contact point 18 and to the second sense 22. The resistance along these paths will be referred to as a contact resistance.

Figure 2:
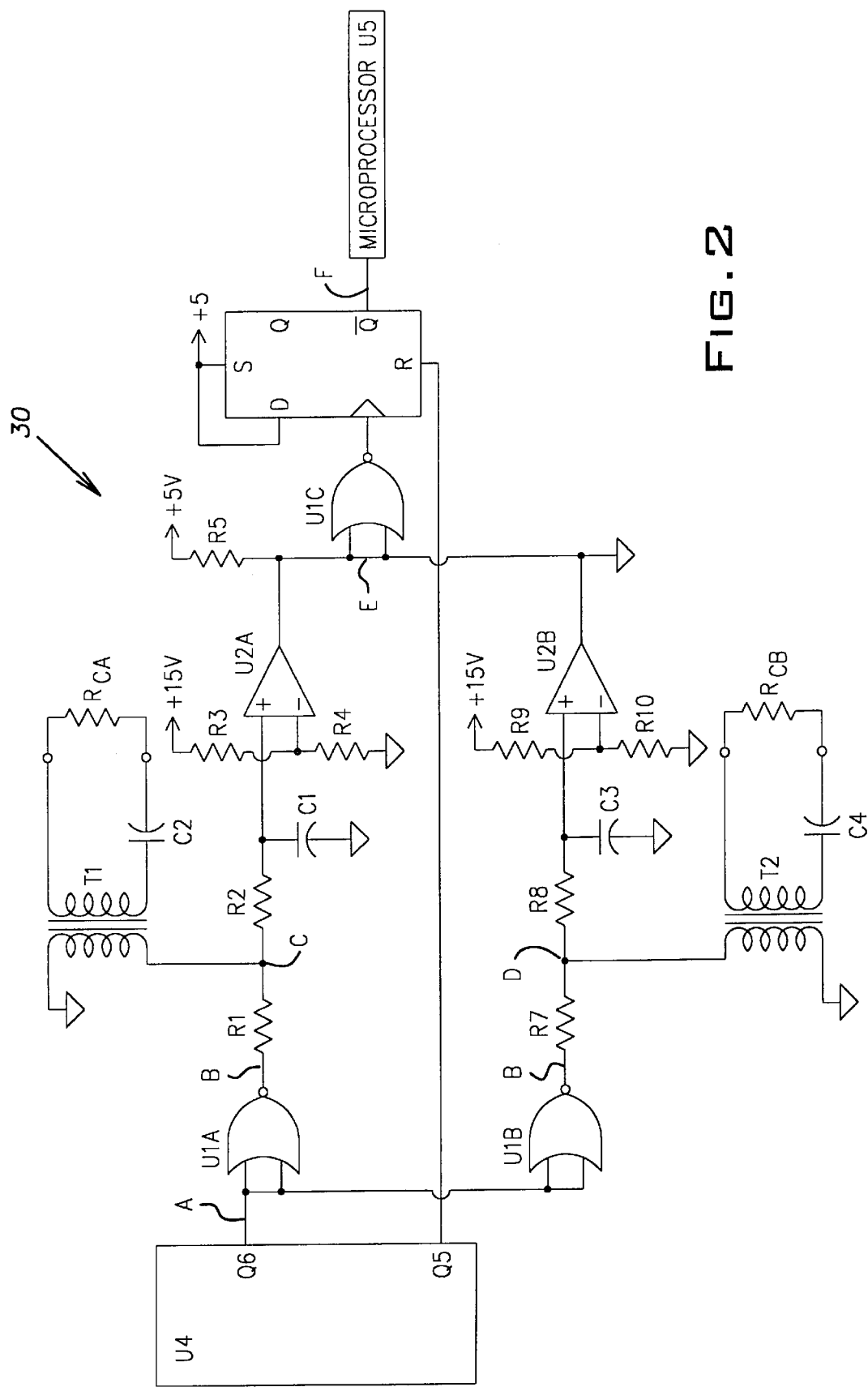
FIG. 2. is a circuit diagram of the first embodiment of the present invention.
Figure 3:
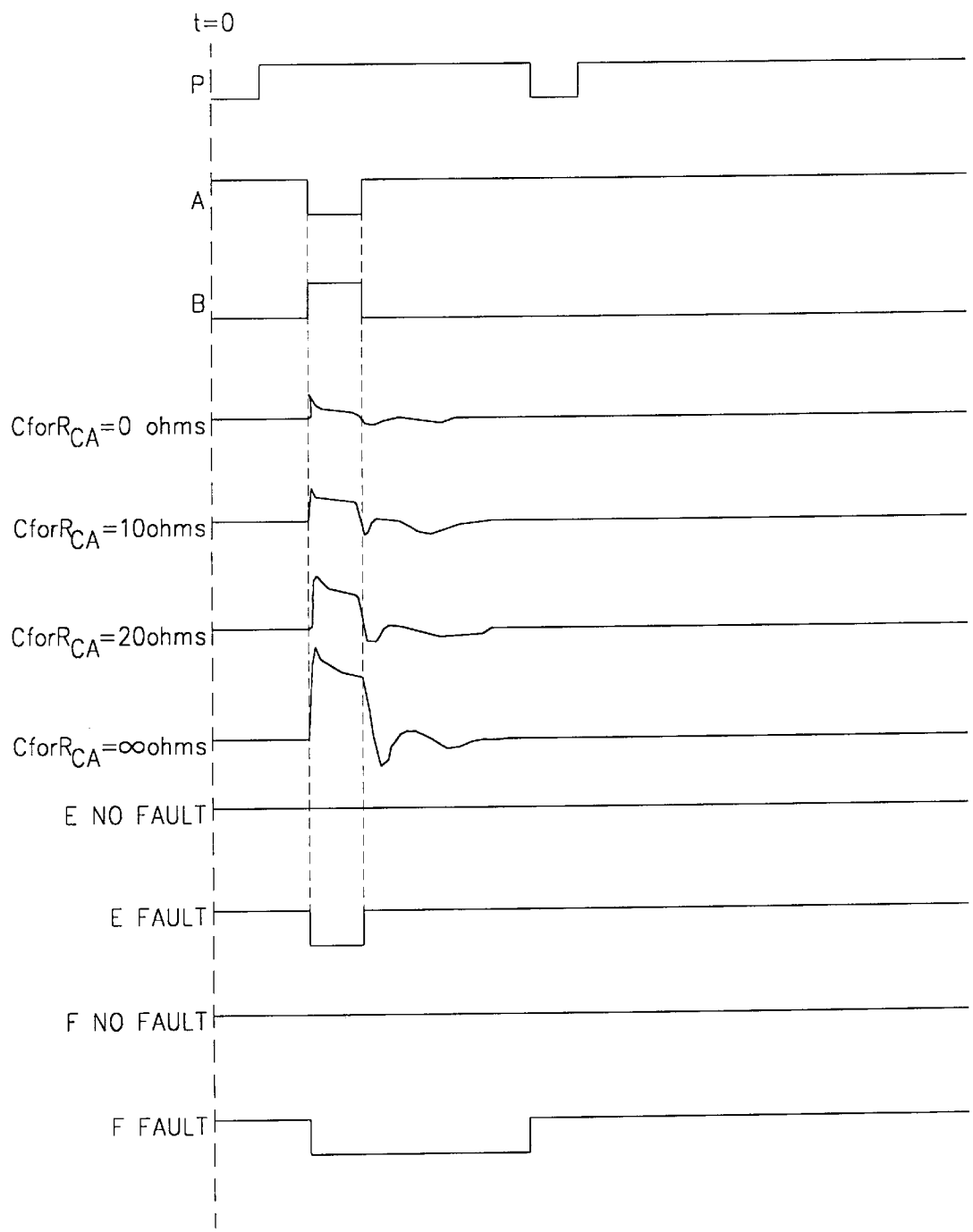
FIG. 3 is a timing diagram of the first embodiment of the present invention.

Referring now to FIGS. 2 and 3, a circuit diagram and a timing diagram of the first embodiment of the present invention are respectively shown. The two contact resistances of the Kelvin connection for the DUT 10 are shown as $R_{CA}$ and $R_{CB}$. If the magnitude of just one of the contact resistances is too high, then this is an indication that the Kelvin connection is faulty. If the Kelvin connection is faulty, then the reliability of any test measurements of the DUT will be questionable.

In order to conduct a contact check of the Kelvin connection, the circuit 30 shown in FIG. 2 is connected to the contact resistances $R_{CA}$ and $R_{CB}$. It should be understood that the circuit 30 is connected independent of any circuit (not shown) used to make the test measurement of the DUT 10.

Under software control, a microprocessor U4 generates a clearing pulse (indicated by P in FIG. 3) at pin Q5. The duration of the clearing pulse is preferably very short (e.g., 6 microseconds). Pin Q5 is connected to pin R of a flip flop U3. The pulse P clears the output $\overline{Q}$ of the flip flop U3.

After a brief pause (e.g., a few microseconds), the software then generates a short input pulse A (e.g., a 10 microseconds pulse) at pin Q6 of the microprocessor U4. One skilled in the art will appreciate that the microprocessor can be replaced with other devices, such as switches or a one-shot. The input pulse is inverted by inverters U1A and U1B as shown as waveform B. Waveform B drives the primary windings of transformers T1 and T2 through R1 and R7. Secondary windings of transformers T1 and T2 are respectively connected in series with capacitors C2 and C4. The T1/C2 and T2/C4 networks are respectively connected to the contact resistances $R_{CA}$ and $R_{CB}$. The transformers T1 and T2 are used for common mode isolation of the contact check circuit 30 from the DUT 10.

Waveform B is altered so that the magnitude of the voltages at points C and D are respectively dependent upon the magnitude of the contact resistances $R_{CA}$ and $R_{CB}$. The resulting signal is a check pulse. FIG. 3 shows sample check pulses at point C for contact resistance $R_{CA}$ values of zero ohms (i.e., a perfect connection), 10 ohms, 20 ohms and infinite ohms (i.e., an open circuit). The same result will occur at point D for similar values of $R_{CB}$. As the example check pulses for point C indicate, greater magnitudes of the contact resistances $R_{CA}$ and $R_{CB}$ will produce higher voltages at points C and D for the input pulse A produced by pin Q6. Capacitors C2 and C4 are provided to prevent DC current from flowing between the sources and senses of $R_{CA}$ and $R_{CB}$.

Threshold voltages are generated for each contact resistance $R_{CA}$ and $R_{CB}$. The threshold voltage for $R_{CA}$ is generated by a voltage divider formed by resistors R3 and R4. The threshold voltage for $R_{CB}$ is generated by a voltage divider formed by resistors R9 and R10. Comparators U2A and U2B respectively compare the voltage of the check pulses at points C and D with the threshold voltages for $R_{CA}$ and $R_{CB}$. Low pass filters are provided for each comparator U2A and U2B to eliminate false tripping of the comparators. The low pass filter for comparator U2A is formed by R2 and C1, and the low pass filter for the comparator U2B is formed by R8 and C3.

Therefore, if the voltage of the check pulses at either C or D does not exceed their respective threshold voltages, then the voltage at input E of U1C will remain constant indicting that there is no fault in the Kelvin connection (see FIG. 3). However, if the voltage of the check pulses at either C or D does exceed their respective threshold voltages, then the voltage at input E of U1C will not remain constant indicting that there is a fault in the Kelvin connection (see FIG. 3). The outputs of the comparators, or fault indication signals, are NOR-gated together through U1C so as to invert the fault indication signal. The flip flop U3 will store any indication of a fault at output $\overline{Q}$ as waveform F until it is cleared by a second pulse P.

A microprocessor U5 monitors waveform F stored at the output $\overline{Q}$ of flip flop U3 for a fault indication. If a fault occurs, the microprocessor U5 will display a contact check failed message. One skilled in the art will appreciate that microprocessors U4 and U5 may be consolidated into a single microprocessor.

Table 1 shows example values for the circuit components shown in FIG. 2.

TABLE 1

| Component: | Value: |
| --- | --- |
| U1A, U1B & U1C | 74HC02 |
| U2A & U2B | LM393 |
| U3 | 74HC74 |
| R1 | 2 kΩ |
| R2 | 10 kΩ |
| R3 | 15 kΩ |
| R4 | 160 Ω |
| R5 | 475 Ω |
| R7 | 2 kΩ |
| R8 | 10 kΩ |
| R9 | 15 kΩ |
| R10 | 160 kΩ |
| C1 | 47 pF |
| C2 | 0.47 μF |
| C3 | 47 pF |
| C4 | 0.47 μF |

The check circuit 30 has little or no impact on the test measurement of the DUT 10 and completes its check in a very short time period (less than 30 microseconds). The contact check may be made concurrently or consecutively with the DUT test measurement.

One skilled in the art will appreciate that the DUT 10 may have additional contact points connected to additional sources and senses. The present invention may be adapted to check any additional contact resistances by replicating the circuitry of the present invention. Alternatively, only one contact resistance need be measured by reducing the circuitry of the present invention to a single transformer/comparator network.

One skilled in the art will also appreciate that the contact resistance may have the properties of an impedance and will therefore be a contact impedance. The present check circuit 30 may also be used to verify the electrical connection in the presence of a contact impedance.

Figure 4:
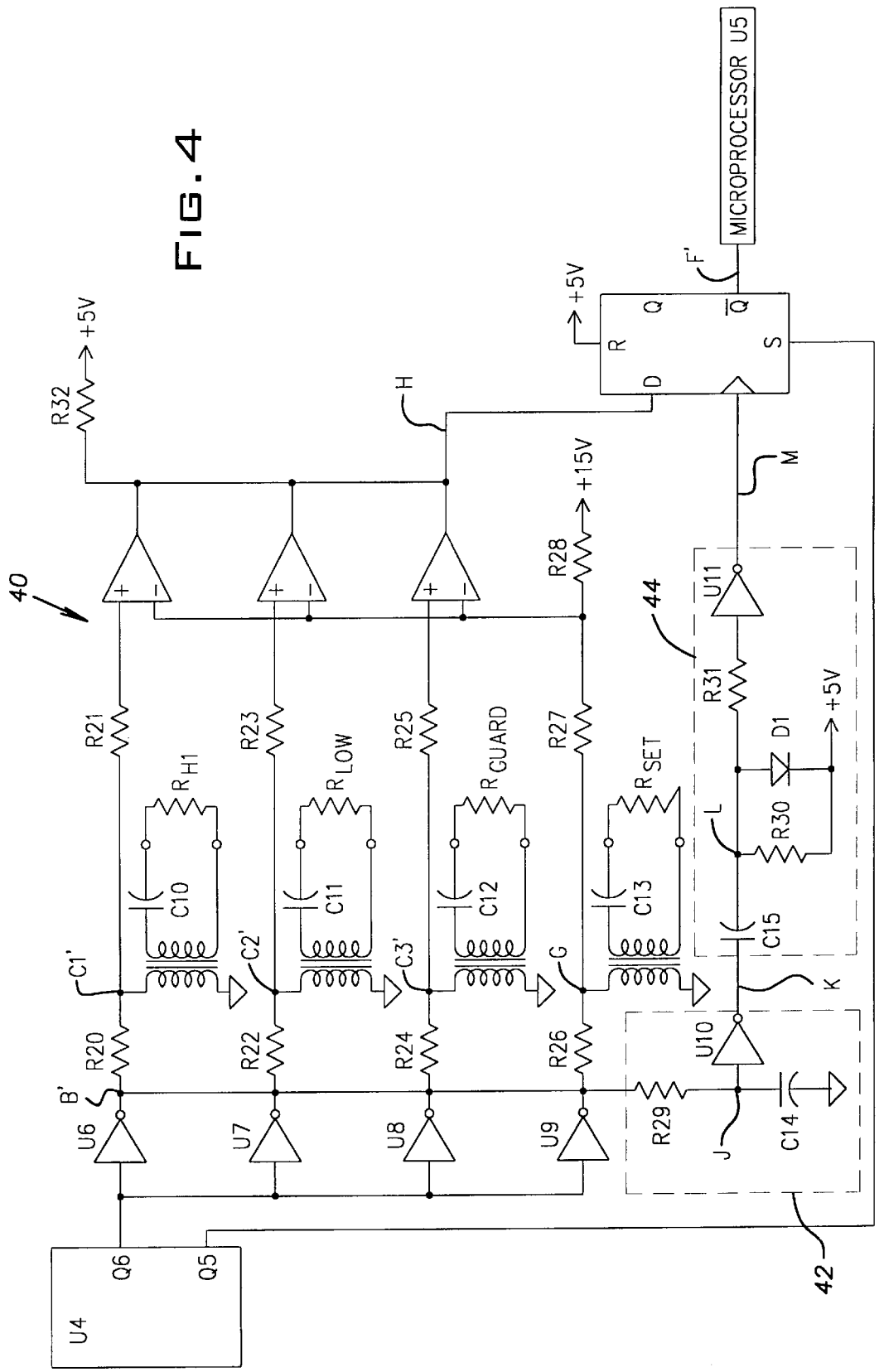
FIG. 4 is a circuit diagram of the second embodiment of the present invention.
Figure 5:
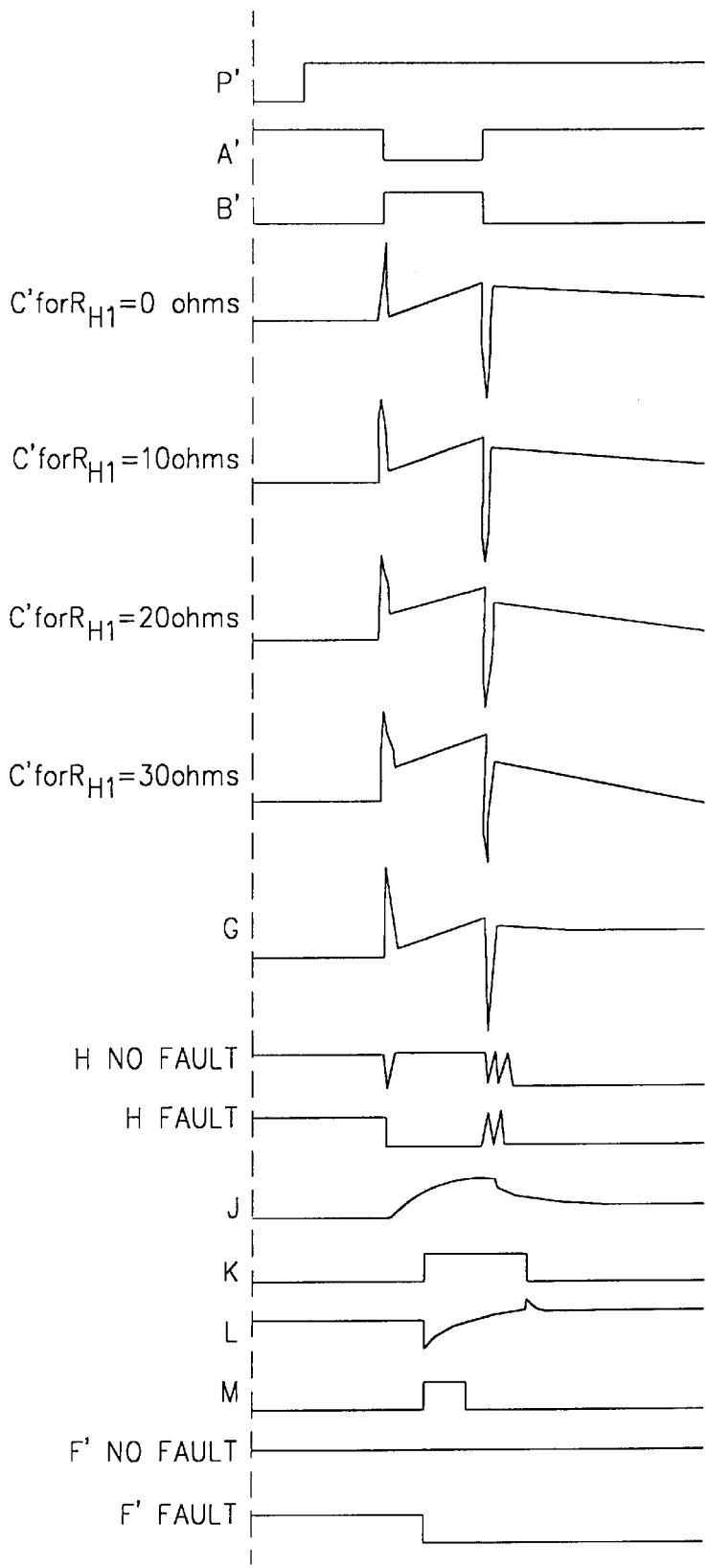
FIG. 5 is a timing diagram of the second embodiment of the present invention.

Referring now to FIGS. 4 and 5, a circuit diagram and a timing diagram of the second embodiment of the present invention are respectively shown. In this embodiment, three contact resistances $R_{H1}$, $R_{LOW}$ and $R_{GUARD}$ are checked. However, the threshold voltage used by the comparators is derived from a known control resistance $R_{SET}$, rather than the voltage divider of the first embodiment.

In order to conduct a contact check of the Kelvin connection using the second embodiment, the circuit 40, shown in FIG. 4, is connected to the contact resistances $R_{H1}$, $R_{LOW}$ and $R_{GUARD}$. It should be understood that the circuit 40 is connected independent of any circuit (not shown) used to make the test measurement of the DUT 10.

Under software control, the microprocessor U4 generates a clearing pulse (indicated by P' in FIG. 3) at pin Q5. The duration of the clearing pulse P' is preferably very short (e.g., 6 microseconds). Pin Q5 is connected to pin S of a flip flop U3. The pulse P' clears the output Q of the flip flop U3.

After a brief pause (e.g., a few microseconds), the software then generates a short input pulse A' (e.g., a 10 microsecond pulse) at pin Q6 of the microprocessor U4. The input pulse is inverted by inverters U6, U7, U8 and U9 as shown as waveform B'. Waveform B' drives the primary windings of transformers T10, T11 and T12 through R20, R22 and R24 respectively. Secondary windings of transformers T10, T11 and T12 are respectively connected in series with capacitors C10, C11 and C12. The T10/C10, T11/C11 and T12/C12 networks are respectively connected to the contact resistances $R_{H1}$, $R_{LOW}$ and $R_{GUARD}$. The transformers T10, T11 and T12 are used for the common mode isolation of the contact check circuit 40 from the DUT 10.

Waveform B is altered so that the magnitude of the voltage at points C1', C2' and C3' are respectively dependent upon the magnitude of the contact resistances $R_{H1}$, $R_{LOW}$ and $R_{GUARD}$. FIG. 3 shows sample check pulses at point C1' for contact resistance $R_{H1}$ values of zero ohms (i.e., a perfect connection), 10 ohms, 20 ohms and 30 ohms. The same result will occur at points C2' and C3' for similar values of $R_{LOW}$ and $R_{GUARD}$. As the example check pulses for point C1' indicate, greater magnitudes of the contact resistances $R_{H1}$, $R_{LOW}$ and $R_{GUARD}$ will produce higher voltages at points C1', C2' and C3' for the input pulse A' produced by pin Q6. Capacitors C10, C11 and C12 are provided to prevent DC current from flowing between the sources and sense of contact resistances $R_{H1}$, $R_{LOW}$ and $R_{GUARD}$.

A threshold voltage G is generated for the contact resistances $R_{H1}$, $R_{LOW}$ and $R_{GUARD}$ by driving transformer T13 with the inverted input pulse known as waveform B'. Waveform B' drives the primary windings of transformer. T13 through R26. Secondary windings of transformer T13 is connected in series with capacitor C13. The T13/C13 network is connected to a resistance of known value, or control resistance $R_{SET}$. Control resistance $R_{SET}$ alters waveform B' to produce threshold voltage G.

Comparators U2A, U2B and U2C respectively compare the voltage of the check pulses at points C1', C2' and C3' with the threshold voltage G. The outputs of comparators U2A, U2B and U2C are normally high, and remain high during the duration of the input pulse A in the absence of a faulty contact. However, the outputs of comparators U2A, U2B and U2C will be pulled low if the comparator's respective contact resistance $R_{H1}$, $R_{LOW}$ or $R_{GUARD}$ exceeds $R_{SET}$. Therefore, if the voltage of the check pulses at any of C1', C2' or C3' does not exceed the threshold voltage G, then the voltage at the input D of the flip flop U3 will remain constant during the duration of the input pulse A' indicating that there is no fault in the Kelvin connection (see FIG. 3, waveform or fault indication signal H). However, if the voltage of the check pulses at any of C1', C2' or C3' does exceed the threshold voltage G, then the voltage at the input D of the flip flop U3 will not remain constant indicating that there is a fault in the Kelvin connection (see FIG. 3, waveform H). Resistor 28 is used to ensure that any offsets among the comparators U2A, U2B and U2C do not artificially cause a comparator to trip. The output of the comparators U2A, U2B and U2C, or fault indication signal H, are wire NOR gated together to produce the fault indication signal H.

As illustrated in FIG. 5, the waveforms in circuit 40 are susceptible to voltage spiking at the beginning and end of the input pulse A'. Since this voltage spiking may cause incorrect fault indications, the fault indication signal H is preferably sampled during the middle of the input pulse A'. To do this, inverted input pulse B' is delayed by a delay 42 made from resistor R29 and capacitor C14 as shown as waveform J. The delay also includes inverter U10 which squares waveform J as shown as waveform K. A differentiator 44 made from resistor R30 and capacitor C15 differentiates waveform K as shown as waveform L. The differentiator 44 also includes inverter U11 which squares waveform L as shown as waveform, or clock pulse M. As illustrated in FIG. 5, clock pulse M is a short pulse occurring during the middle of the input pulse A'. Diode D1 and resistor R31 are used to protect the input of inverter U11 from transients signals created when the output of inverter U10 returns low and the charge on capacitor C15 can force waveform L to a value below ground.

The output of the differentiator subcircuit 44 is connected to the clock input of flip flop U3. Hence, clock pulse M is used to clock the flip flop U3. If there is a fault in the Kelvin Connection, the fault indication signal H will be low when flip flop U3 is clocked by the clock pulse M and a low will be clocked through to the output Q of flip flop U3 as waveform F'. If there is no fault in the Kelvin Connection, the fault indication signal H will be high when flip flop U3 is clocked by the clock pulse M and a high will be clocked through to the output Q of flip flop U3 as waveform F'.

The flip flop U3 will store any indication of a fault at output Q as waveform F'. Microprocessor U5 monitors waveform F' stored at the output Q of flip flop U3 for a fault indication. If a fault indication occurs, the microprocessor U5 will display a contact check failed message. One skilled in the art will appreciate that other means of generating a faulty contact alert may be equivalently employed. For example, the output Q could be used to drive a visual display such as an LED, or an audible display such as a piezoelectric buzzer.

Table 2 shows example values for the circuit components shown in FIG. 4.

TABLE 2

| Component: | Value: |
|---|---|
| U2A, U2B & U2C | LM339 |
| U3 | 74HC74 |
| U6, U7, U8, U9, U10 & U11 | 74HC14 |
| R20 | 2 kΩ |
| R21 | 100 Ω |
| R22 | 2 kΩ |
| R23 | 100 Ω |
| R24 | 2 kΩ |
| R25 | 100 Ω |
| R26 | 2 kΩ |
| R27 | 100 Ω |
| R28 | 75 kΩ |
| R29 | 6.65 kΩ |
| R30 | 10 kΩ |
| R31 | 1 kΩ |
| C10 | 0.47 μF |
| C11 | 0.47 μF |
| C12 | 0.47 μF |
| C13 | 0.47 μF |
| C14 | 1 nF |
| C15 | 1 nF |
| D1 | Low Power Schottky |

The check circuit 40 has little or no impact on the test measurement of the DUT 10 and completes its check in a very short time period (less than 30 microseconds). The contact check may be made concurrently or consecutively with the DUT test measurement.

Although particular embodiments of the invention have been described in detail, it will be understood that the invention is not limited correspondingly in scope, but includes all changes and modifications coming within the spirit and terms of the claims appended hereto.

What is claimed is:

1. A method for checking a contact resistance, comprising the steps of:
   generating an input pulse by a microprocessor;
   driving a first transformer connected to the contact resistance with the input pulse so as to create a check pulse;
   generating a threshold voltage by driving a second transformer connected to a control resistance with the input pulse; and
   comparing the check pulse and the threshold voltage to generate a contact fault indication signal.

2. The method according to claim 1, further comprising the steps of:
   storing the fault indication signal; and
   monitoring the stored signal by the microprocessor.

3. The method according to claim 1, further comprising the step of:
   inverting the input pulse before driving the transformers.

4. The method according to claim 1, further comprising the steps of:
   delaying the input pulse to generate a clock pulse;
   clocking a storage device with the clock pulse; and
   storing the fault indication signal in the storage device.

5. A contact resistance check circuit, comprising:
   an input pulse generator;
   a transformer having a primary winding electrically connected to the input pulse generator and a secondary winding electrically connected to the contact resistance;
   a comparator having a first input electrically connected to the primary winding, a second input electrically connected to a threshold voltage generator, and an output electrically connected to a fault indication signal monitoring device.

6. A contact resistance check circuit, comprising:
   a microprocessor for generating an input pulse;
   a first transformer having a primary winding connected to be driven by the input pulse and a secondary winding connected to the contact resistance, said transformer/contact resistance connection altering the input pulse in relation to the magnitude of the contact resistance so as to create a check pulse;
   a comparator connected to compare the check pulse and a threshold voltage generated by a second transformer having a primary winding connected to be driven by the input pulse and a secondary winding connected to a control resistance, said comparator generating a contact fault indication signal; and
   a flip flop connected to store the fault indication signal for monitoring by the microprocessor.

7. The circuit according to claim 6, further comprising a delay connected to delay the input pulse and the delay connected to clock the flip flop with the delayed input pulse.

8. The circuit according claim 6, further comprising an inverter connected to invert the input pulse before driving the transformers.

* * * * *